United States Patent [19]

Kobari et al.

[11] Patent Number: 4,973,959
[45] Date of Patent: Nov. 27, 1990

[54] DIGITAL PULSE CIRCUIT FOR PROCESSING SUCCESSIVE PULSES

[75] Inventors: Katsuo Kobari; Yoshitaka Takekoshi; Mitsuyuki Taniguchi, all of Tokyo, Japan

[73] Assignee: Fanuc Ltd., Yamanashi, Japan

[21] Appl. No.: 196,200

[22] PCT Filed: Sep. 9, 1987

[86] PCT No.: PCT/JP87/00666

§ 371 Date: May 4, 1988

§ 102(e) Date: May 4, 1988

[87] PCT Pub. No.: WO88/02104

PCT Pub. Date: Mar. 24, 1988

[30] Foreign Application Priority Data

Sep. 10, 1986 [JP] Japan .................... 61-211718

[51] Int. Cl.$^5$ .................. H03M 1/24; G01D 5/245
[52] U.S. Cl. .................................. 341/13; 375/26
[58] Field of Search .................. 341/13, 94, 118; 375/26

[56] References Cited

U.S. PATENT DOCUMENTS 4,064,504 12/1977 Lepetit et al. .................. 341/118
4,443,738 4/1984 Breslow .................. 341/13
4,631,520 12/1986 Wingate .................. 341/13
4,700,063 10/1987 Hara .................. 341/13

FOREIGN PATENT DOCUMENTS 55-123818 2/1980 Japan .
59-27221 2/1984 Japan .

Primary Examiner—William M. Shoop, Jr.
Assistant Examiner—Marc S. Hoff
Attorney, Agent, or Firm—Armstrong, Nikaido, Marmelstein, Kubovcik & Murray

[57] ABSTRACT

A digital pulse circuit receives parallel N digital signals, assuming N is an even integer equal to or greater than 4, the levels of the signals inverted every time a constant quantity of change in an objective quantity to be measured occurs, any phase differences between the successive signals of the signals about 1/N of the constant quantity; has a logic circuit which enables only two signals which can change state in due process corresponding to the next change of the objective quantity to be measured, to enter the next stage; and synchronizes each of the N digital signals by a clock pulse, to make any phase difference among the N digital signals equal to or more than a predetermined phase difference, and the remove the influence of noise superposed on the digital signals (FIG. 10). In addition, a digital pulse circuit mentioned above; synchronizes each of the N digital signals by a clock pulse; and further synchronizes each of the synchronized signals by the clock pulse, once again; and enables only two signals which can change their states in due process corresponding to the next change of the objective quantity to be measured, among the signals synchronized once, to enter the next stage; and when two of the once-synchronized signals have changed at the same time, maintains the two once-synchronized signals so as not to be synchronized twice, until one of the two signals returns to the state just before the change (FIG. 14).

18 Claims, 16 Drawing Sheets

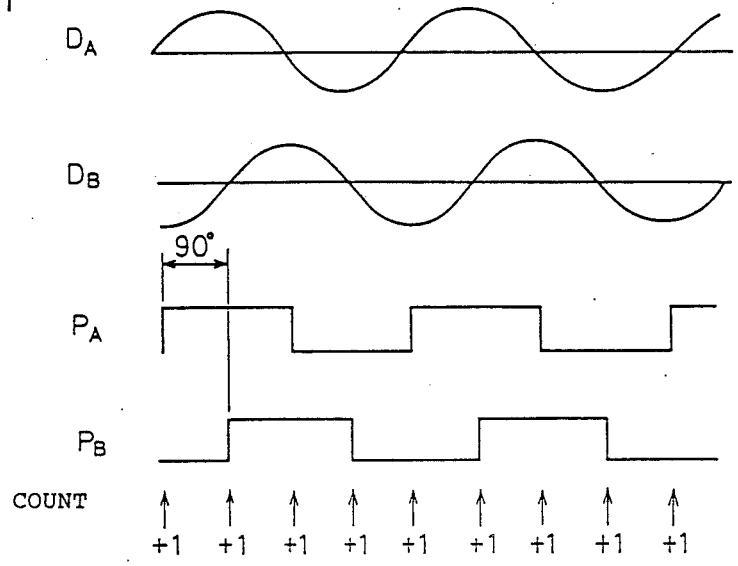
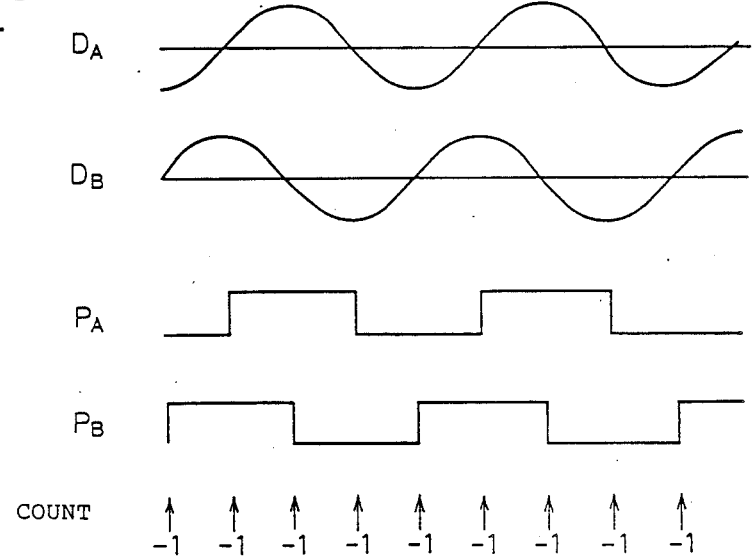

DIGITAL PULSE CIRCUIT FOR PROCESSING SUCCESSIVE PULSES

DESCRIPTION

1. Technical Field

The present invention relates to a digital pulse circuit for maintaining required intervals between succession pulses and for suppressing noise in the pulses.

The present invention is particularly advantageously used for processing output pulses of high-resolution pulse encoder circuit.

2. Background Art

Pulse encoders are used for precise position detection in numerical control (NC) apparatuses or the like.

In general, two types of pulse encoders are known; an incremental type and an absolute type. Recently, incremental type pulse encoders having a simple constitution and functioning substantially as an absolute type, have been proposed. (Cf. JPA No.60-218027, and No.218029)

As shown in FIG. 1, the pulse encoder, as mentioned above has an rotating code disc 111 a pair of light-emitting devices 112a, 112b, a pair of light-detecting devices 113a, 113b, light-detecting device output amplifiers 114a and 114b, and a rectangular pulse generating circuit 120. The rotating code disc 111 is fixed to a rotation axle which rotates in correspondence with a motion of an object, and accordingly rotates with the rotation axle. The pulse encoder is provided with a pair of light-emitting devices 112a, 112b and the pair of light-detecting devices 113a, 113b are provided on opposite sides of the rotating code disc 111. And each of the light-emitting devices 112a, 112b and a corresponding one of the light-detecting devices 113a, 113b confronting each other with the rotating code disc 111 intervening therebetween. The circumference of the rotating code disc 111 is provided with alternative patterns of a translucent part and nontranslucent part. When the rotating code disc 111 rotates, a part of light emitted from each of the light-emitting devices 112a, 112b passes through the translucent parts of the rotating code disc 111 and is transformed to an A-phase signal and a B-phase signal respectively, where the phase of the B-phase signal differs by 90° from the phase of the A-phase signal. These signals then transformed into sine wave signals $D_A$ and $D_E$ (as shown in FIG. 2A and FIG. 2B) at light-detecting device output amplifiers 114a and 114b, respectively. The A-phase signal leads the B-phase signal by 90° in phase when the rotating code disc 111 rotates in the positive direction (as shown in FIG. 2A), and the B-phase signal leads the A-phase signal by 90° in phase when the rotating code disc 111 rotates in the negative direction (as shown in FIG. 2B). The above sine wave signals $D_A$ and $D_E$ enter the rectangular pulse generating circuit 120. The rectangular pulse generating circuit 120, for example, is provided with a comparator for comparing the levels of input signals with a predetermined threshold level, and thus, rectangular pulses $P_A$ and $P_E$, as shown in FIG. 2A and FIG. 2B, are obtained. Although not shown, in general, NC apparatuses are produced with a counter for counting the above rectangular pulses $P_A$ and $P_B$, and thus are able to determine the direction of the rotation of the rotating code disc 111, as explained later. The counter in the NC apparatus detects the direction of the rotating code disc 111, namely, the counter determines the direction of motion of the object from the sign of the phase-difference between the above pulses $P_A$ and $P_B$. At every timing of a leading (rising) edge and a trailing (falling) edge of the pulses $P_A$ and $P_E$, the count at the counter in the NC apparatus is incremented if the positive direction is determined, and the count is decremented if the negative direction is determined.

FIGS. 3A–3H show the manner of counting at the counter in the NC apparatus as mentioned above. The counting ($\pm 1$) is made according to the level of one of the pulses $P_A$ and $P_B$ and the direction of the transition of the level (leading edge or trailing edge of the pulses) in the other of the pulses $P_A$ and $P_B$.

To obtain information on the position of the above object from outputs of the pulse encoder with high resolution, first a series of sine waves $D_A$ and $D_B$ are generated, each having a different phase and each sine wave leads a following sine wave by a constant phase difference The series of sine waves are input to the aforementioned rectangular pulse generating circuit to obtain rectangular pulses with the abovementioned phase difference.

FIG. 4 shows a construction of an apparatus used to execute the abovementioned procedure for obtaining high resolution.

The apparatus of FIG. 4 consists of light-detecting devices 113, a light-detecting device output amplifier 114, a comparator 121, and a A/B-phase signal generating circuit 6. The light-detecting devices 113 and the light-detecting output amplifiers 114 each have functions similar to the corresponding construction in FIG.1, the comparator 121 corresponds to the rectangular pulses generating means 120 in FIG. 1, and the A/B-phase signal generating circuit 6 transforms the output signals of the comparator 121 to an A-phase signal $F_A$ and a B-phase signal $F_B$, where the phase of the A-phase signal $F_A$ differs by 90° from the phase of the B-phase signal $F_B$.

Using the abovementioned apparatus, ten rectangular pulses, $D_0, \ldots D_9$, as shown in FIG. 5, were obtained by the inventor. The cycle time of each of the rectangular pulses $D_0, \ldots D_9$ is equal to the cycle time of the aforementioned signals $D_A$ or $D_B$ (or $P_A$ and $P_B$), and the phase of each pulse $D_i$ of the of rectangular pulses $D_0, \ldots D_9$ differs from the phase of a following pulse $D_{i+1}$ by 1/10 of the half cycle of the signals $D_A$ or $D_B$, where $i+0, \ldots 9$. Thus, when the ten rectangular pulses $D_0, \ldots D_9$ are input to the NC apparatus, and are counted, a resolution the phase of each pulse of which is delayed by 1/10, 2/10, ... 9/10 of the half cycle time of the aforementioned signals $D_A$ or $D_E$ a five times greater resolution than the resolution obtained by merely counting the aforementioned rectangular pulses $P_A$ and $P_B$ shown in FIGS. 2A and 2B is obtained. For example, the above ten rectangular pulses $D_0, \ldots D_9$ can be obtained from the aforementioned signals $D_A$ and $D_B$ using the construction shown in FIG. 6. In the construction shown in FIG. 6, an input having a voltage $\sin\theta$ is applied to one terminal of the series connected of resisters $R_1$ and $R_2$, and another input having a voltage $\sin(\theta + \pi/2) = \cos\theta$ is applied to another terminal of the series connected of resisters $R_1$ and $R_2$. The voltage level of the connecting point of the resisters $R_1$ and $R_2$ becomes $(R_1^2 + R_2^2)^{1/2} \sin(\theta + \tan^{-1} R_1/R_2)/(R_1 + R_2)$. Therefore, a sine wave with an arbitrary phase difference from the input sine wave can be obtained when the resistance values of the resisters $R_1$ and $R_2$ are suitably selected, i.e., any one of the above ten rectangular pulses $D_0, \ldots D_9$ can be obtained from the aforementioned signals $D_A$ and $D_B$ using the construction shown in FIG. Generally when N is even number.

N rectangular pulses $D_0, \ldots D_{N-1}$ were obtained by the inventor using a similar apparatus, where the cycle time of each of the rectangular pulses $D_0, \ldots D_{N-1}$ is equal to the cycle time of the aforementioned signals $D_A$ or $D_B$ (or $P_A$ and $P_B$), and the phase of each pulse $D_i$ of the rectangular pulses $D_0, \ldots D_{N-1}$ differs from the phase of a following pulse $D_{i+1}$ by I/N of the half cycle time of the signals $D_A$ or $D_B$, where $i=0, \ldots N-1$. Thus, when the ten rectangular pulses $D_0, \ldots D_9$ are input into the NC apparatus, and are counted, a resolution N/2 times greater than the resolution obtained by merely counting the aforementioned rectangular pulses $P_A$ and $P_B$ shown in FIGS. 2A and 2B is obtained.

The ten pulses $D_0, \ldots D_9$ obtained as mentioned above (FIG. 5) are transformed to the two rectangular A-phase and B-phase pulses FA or FB having a phase difference of 90°, so that a high resolution reading of a position measurement at the NC apparatus becomes possible. These two rectangular A-phase and B-phase pulses FA or FB can be obtained by the construction as shown in FIG. 7. The A-phase pulse $F_A$ is obtained by applying the rectangular pulses $D_0, D_2, D_4, D_6, D_8$ to five input terminals of the device shown in of FIG. 7, respectively, and the B-phase pulse $F_B$ is obtained by applying rectangular pulses $D_1, D_3, D_5, D_7, D_9$ to the five input terminals of FIG. 7, respectively (FIG. 5). FIG. 5 shows the timing relationship of these signals $F_A$ and $F_B$ and the abovementioned signals $D_0, \ldots D_9$.

However, in general, the amplitudes of the sine waves $D_A$ and $D_E$ which are successively output from the amplifier 114, are not exactly equal because the amplifiers include offset voltages at the light-detecting device or amplifier. In addition, the phase difference between the sine waves $D_A$ and $D_B$ is not exactly 90°, i. e., there is some error in the phase difference between $D_A$ and $D_B$ due to an error in the production of each slit, relative position of the light-emitting devices 112a, 112b and the light-detecting devices, or delay time at the light-detecting devices or the like.

The abovementioned errors in the sine waves $D_A$ and $D_B$ and the phase difference between $D_A$ and $D_B$ have a large influence on the result when these two sine waves are transformed to the aforementioned N rectangular pulses. In this case, the above errors cause some changes in the timings of the leading edges or trailing edges $D_0, \ldots D_9$, and changes in the time intervals between any two of the leading edges and trailing edges.

However, the NC apparatus which receives the aforementioned rectangular pulses $F_A$ and $F_B$ and which should count the leading edges and trailing edges, can not count the edges when the time interval between any successive leading edges, any successive trailing edges or any successive leading edge and trailing edge of the A-phase and B-phase pulses $F_A$ and $F_B$ becomes less than a limit (minimum countable time interval) $\tau_0$ which is determined by the cycle time of a reading clock in the NC apparatus (about 300 nsec).

Especially, during a high speed rotation, due to fluctuations in the aforementioned time intervals between the leading edges and trailing edges of the $F_A$ and $F_B$, the time intervals may become less than the limit $\tau_0$.

Another problem arises due to noise.

As mentioned before, in the prior art, the rectangular pulses $F_A$ and $F_B$ are obtained as an output of the pulse encoder, by applying the set of $D_0, D_2, D_4, D_6, D_8$ or the set of $D_1, D_3, D_5, D_7, D_9$ to the logic circuit of FIG. 7. Therefore, for example, when noise appears even in only one input signal among $D_0, D_1, \ldots D_9$, the noise has a direct influence on the output pulse $F_A$ or $F_B$. For example, as shown in FIG. 8, when a noise appears in the signal $D_8$, which should be zero during the time interval between a leading edge of $D_0$ and a leading edge of $D_2$, an abnormal notch appears in the shape of $F_A$, through the construction of FIG. 7 as mentioned before. If the timing of the leading edge of $F_B$ is in the time interval where $F_A$ is a low level due to the abovementioned noise, the NC apparatus counts "$-1$", determining the motion of the objective to be in the negative direction at the timing $t_1$, because $F_A$ rises due to the noise while $F_B$ is at a low level (cf. FIG. 3H). Then the NC apparatus counts "$-1$", determining that the motion of the objective is in the negative direction again at timing $t_2$, because $F_B$ rises while $F_A$ is at a low level due to the noise (cf. FIG. 3E), and the NC apparatus counts "$-1$", determining the motion of the objective to be in the negative direction once again at timing $t_3$, because $F_A$ rises due to the noise while $F_B$ is high (cf. FIG. 3F). If the noise mentioned above does not appear in the signal $D_8$, during the interval covering the abovementioned timings $t_1$, $t_2$, and $t_3$, the NC apparatus must count "$+1$" once, determining the motion of the objective to be in the positive direction at the timing $t_2$, because $F_B$ rises while $F_A$ is at a high level. However, when noise appears, the NC apparatus counts "$-3$" during the same interval. This means that, in the high-resolution pulse encoder system of the prior art, an incorrect result may be obtained by the NC apparatus due to the deformation of the output wave from the light-detecting device or noise superposed on the digital signals.

DISCLOSURE OF THE INVENTION

An object of the present invention is to provide a digital pulse circuit for deriving information by incremental pulses from waves output by a light-detecting device in a high-resolution pulse encoder the pulses relate to an objective quantity to be measured, in which the time intervals between incremental pulses are maintained as equal to or longer than the minimum countable time interval in the apparatus which counts the output of the pulse encoder noise superposed on digital signals has no influence on the information relating to an objective quantity to be measured.

Assuming that N is an even integer, equal to or greater than 4, an digital pulse circuit according to the first aspect of the present invention, receives N digital signals in parallel, where the level of each of the N digital signals is inverted every time a constant quantity of change in an objective quantity to be measured occurs, and phase differences between successive signals among the N digital signals correspond to about 1/N of said constant quantity, and comprises: a clock pulse generator which generates a clock pulse having a predetermined cycle time; a first device receiving and synchronizing each of the N digital signals with the above clock; and a second device enabling only two signals among the N digital signals to enter the first device. The states of which can be changed in due corresponding to the next change by 1/N of the above constant quantity of the objective quantity to be measured, among said N digital.

According to the abovementioned construction, the first aspect of the present invention processes the output pulses from a high resolution pulse encoder so that time intervals between successive pulses processed by the above construction are not less than the minimum countable time at the counter, and noise is effectively suppressed.

Again assuming that N is an even integer, equal to or greater than 4, an digital pulse circuit according to the second aspect of the present invention, receives parallel N digital signals in parallel where the level of each of the N digital signals is inverted every time a constant quantity of change in the objective quantity to be measured occurs, and phase differences between successive signals among the N digital signals correspond to about 1/N of the constant quantity, the circuit comprises a clock pulse generator which generates clock pulse having a predetermined cycle time; a first device receiving the above N digital signals and synchronizing each of the N digital signals by the above clock pulse; a second device synchronizing once again each of the output signals from the first device the above clock pulse; a third device enabling only two signals to enter the second means where the two signals the states of can be changed corresponding to the next change of the objective quantity to be measured input signals to said second means, to enter the next and a fourth device detecting the existence of two signals among the output signals of the first device where the states of the two signals are changed (rise to a high level or fall to a low level) during the same cycle of the clock and maintaining the output signals from the second device corresponding to the above two signals, in the same states as just before the changes of the states until one of the above two signals returns to the state just before the above changes.

According to the abovementioned composition, the second aspect of the present invention has a superior noise-suppressing effect to that of the first aspect of the present invention.

BRIEF DISCRIPTION OF DRAWINGS

FIG. 2A and FIG. 2B show the wave shapes of the output pulses of the pulse encoder of FIG. 1;

BEST MODE FOR CARRYING OUT THE INVENTION

Figure 1:
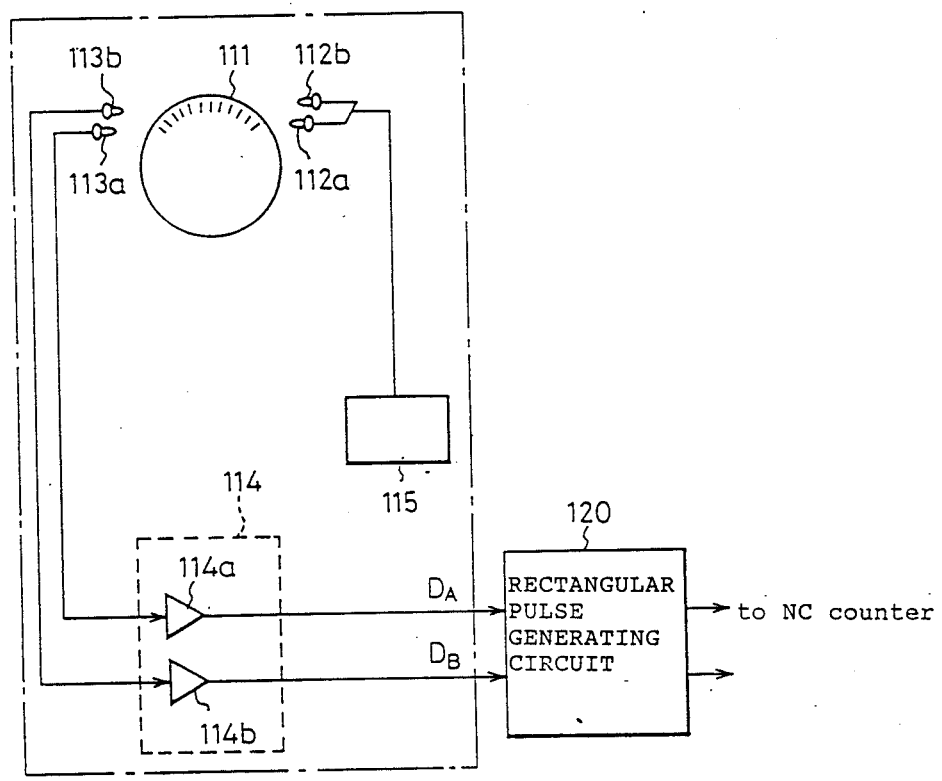
FIG. 1 shows the most basic composition of a circuit for processing output pulses from a light-detecting device in a pulse encoder in the prior art.
Figure 3A:
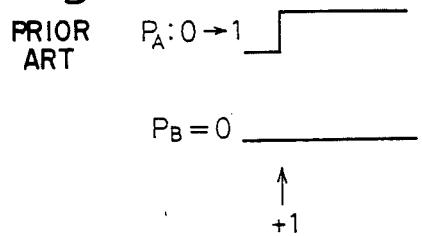
FIGS. 3A-3H show the manner of counting the outputs of the pulse encoder in the counter.
Figure 3B:
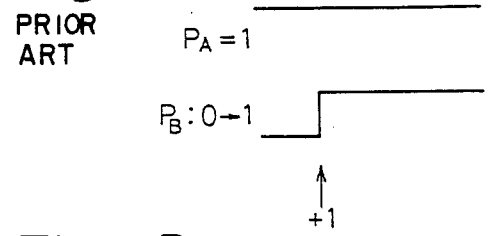
Figure 3C:
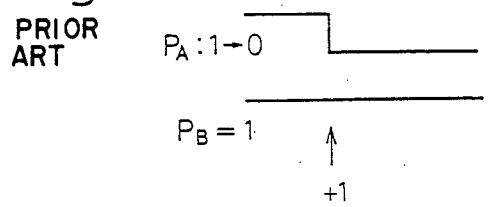
Figure 3D:
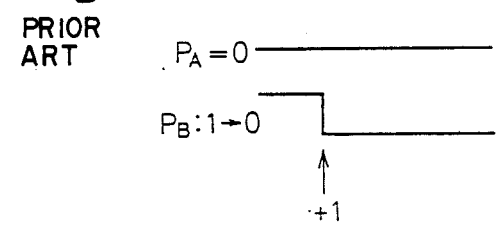
Figure 3E:
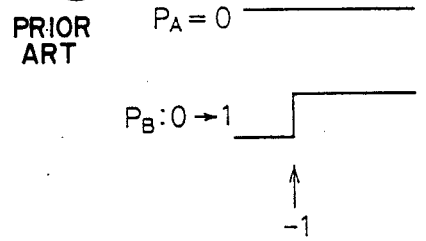
Figure 3F:
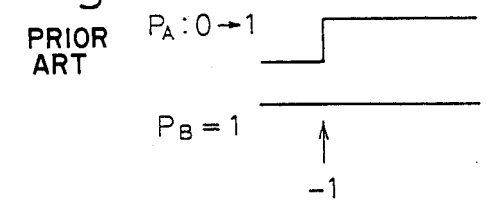
Figure 3G:
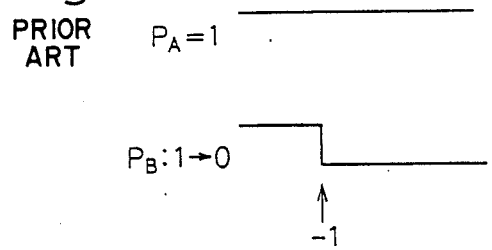
Figure 3H:
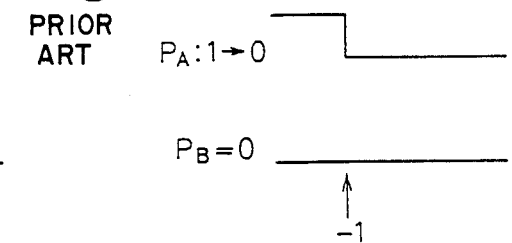
Figure 4:
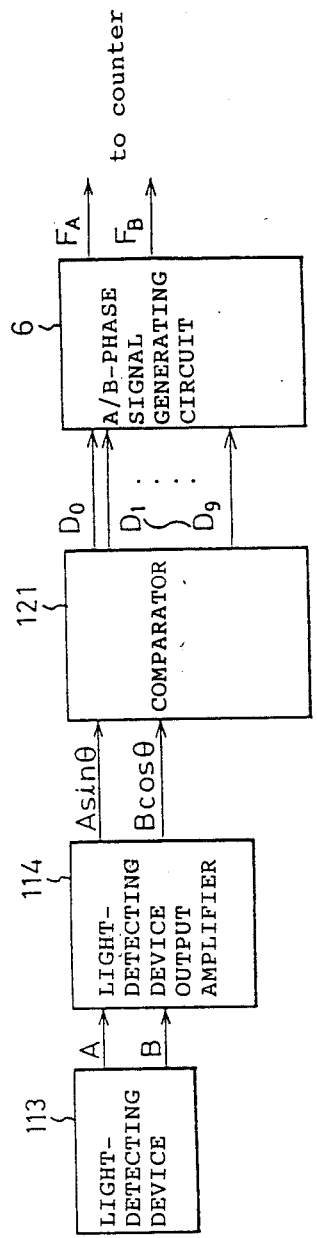
FIG. 4 shows the construction of a circuit for processing pulses from a light-detecting devices in the high resolution pulse encoder of the prior art.
Figure 9:
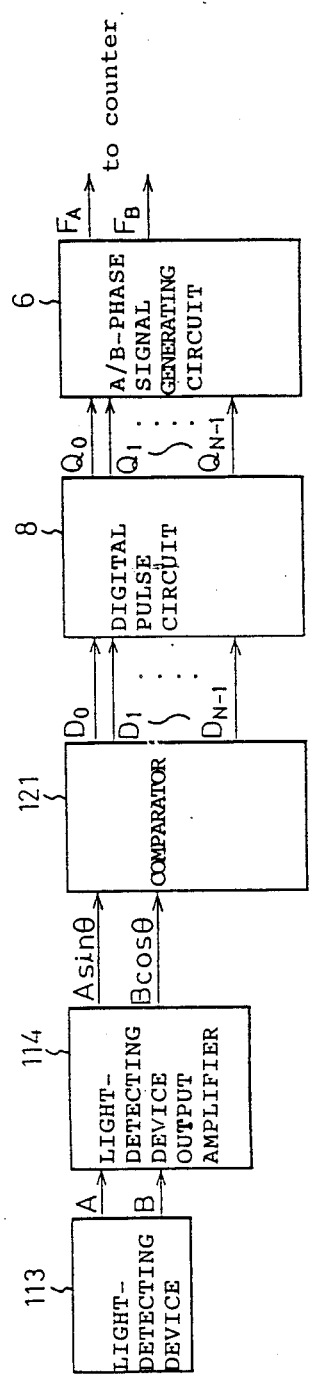
FIG. 9 shows the construction for maintaining required intervals of successive pulses and suppressing noise superposed on processed signals according to the present invention.

FIG. 9 shows the construction of a pulse encoder system using the digital pulse circuit for maintaining required intervals between successive pulses and suppressing noise superposed on processed signals according to the present invention, and the construction of FIG. 9 is provided for solving the aforementioned problem in the composition of FIG. 4 as mentioned before.

In the construction of FIG. 9, a digital pulse circuit 8, according to the present invention, is inserted between the comparator and the A/B-phase signal generating circuit 6 of FIG. 4.

Figure 10:
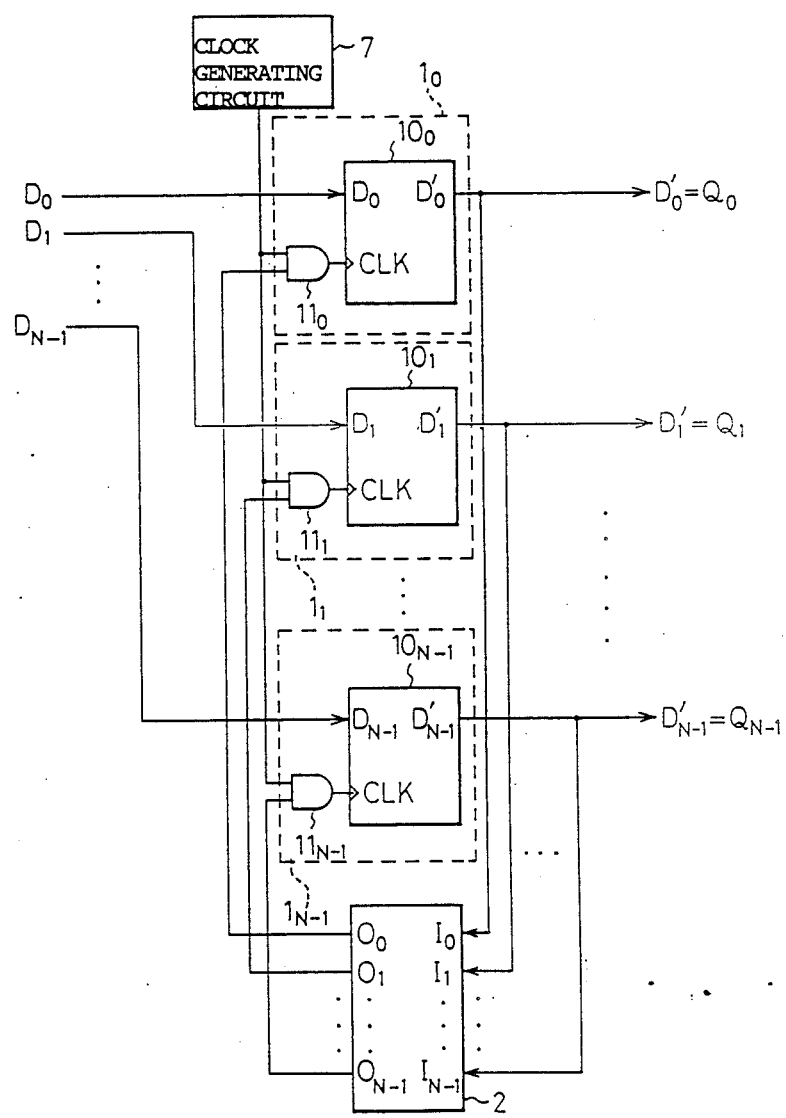
FIG. 10 shows an example of the construction of the digital pulse circuit for maintaining required intervals of successive pulses and suppressing noise superposed on a processed signal according to the first aspect of the present invention.

FIG. 10 shows an example of the construction of the digital pulse circuit for maintaining required intervals between successive pulses and suppressing noise superposed on processed pulses according to the first aspect of the present invention.

Figure 5:
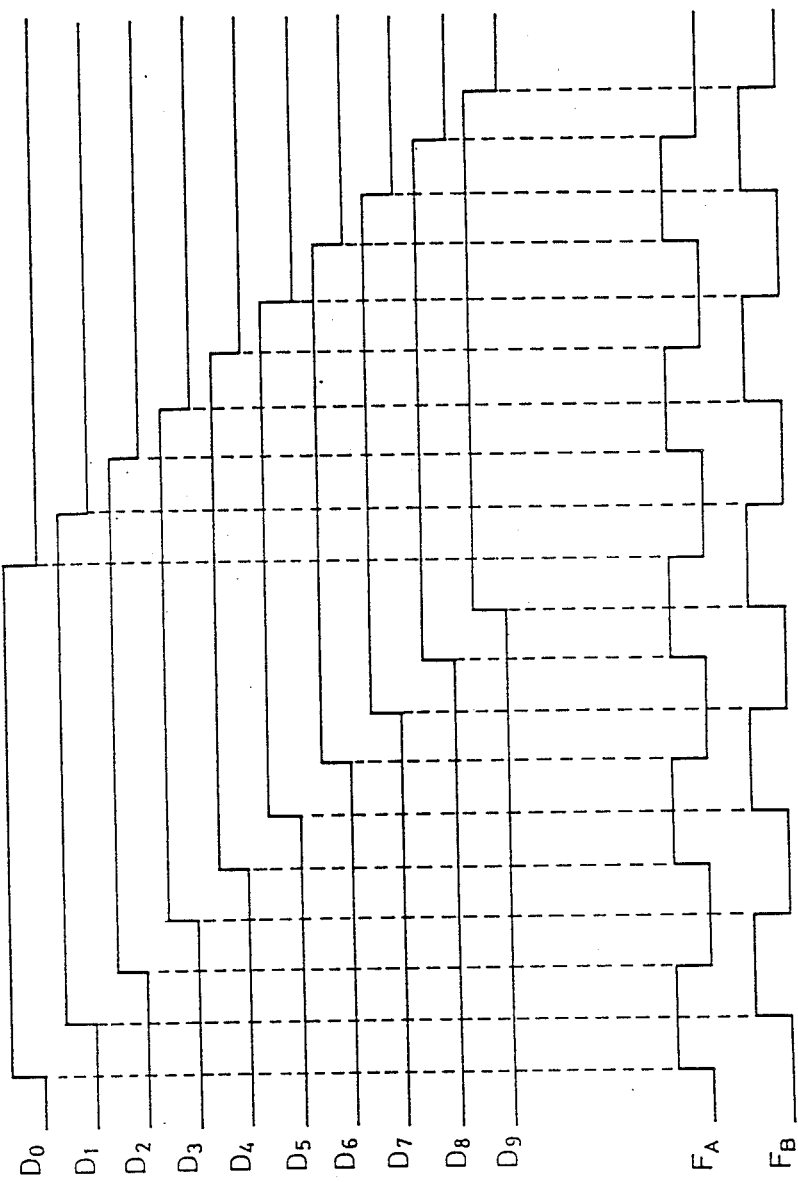
FIG. 5 shows the wave shapes of the output signals of the comparators in FIG. 4 and FIG. 9, and the wave shapes of the output signals of the A/B-phase signal generating circuit.
Figure 6:
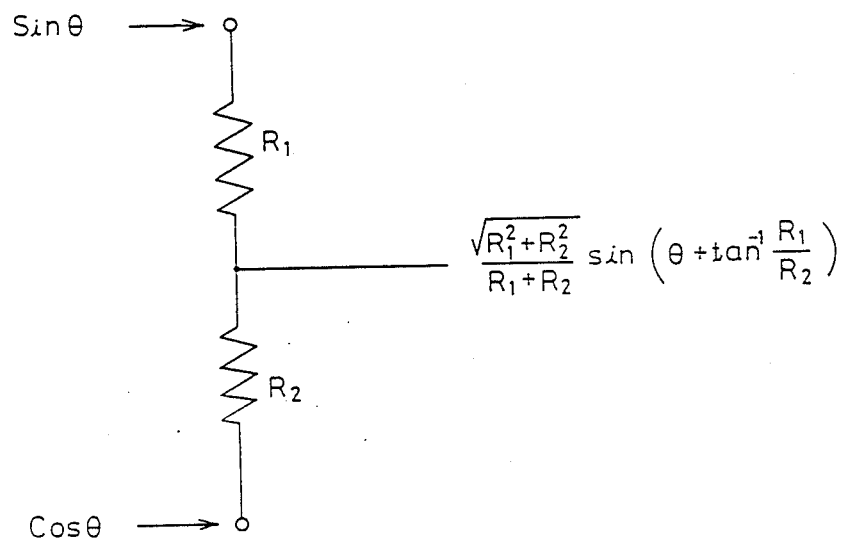
FIG. 6 shows the principle for generating the sine wave having an arbitrary phase difference in the comparators in FIGS. 4 and 9.
Figure 7:
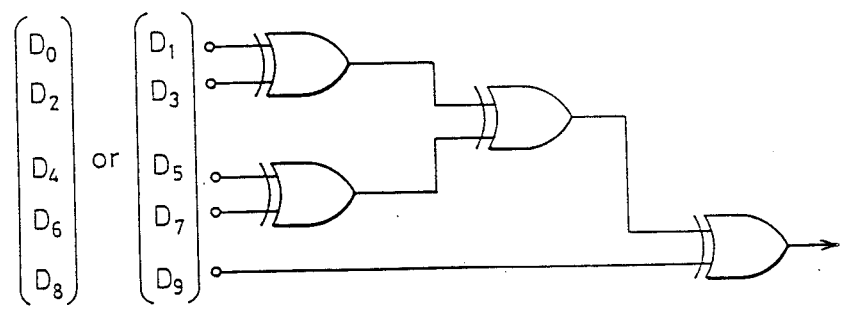
FIG. 7 shows the construction of the A/B-phase signal generating circuit in FIGS. 4 and 9.
Figure 8:
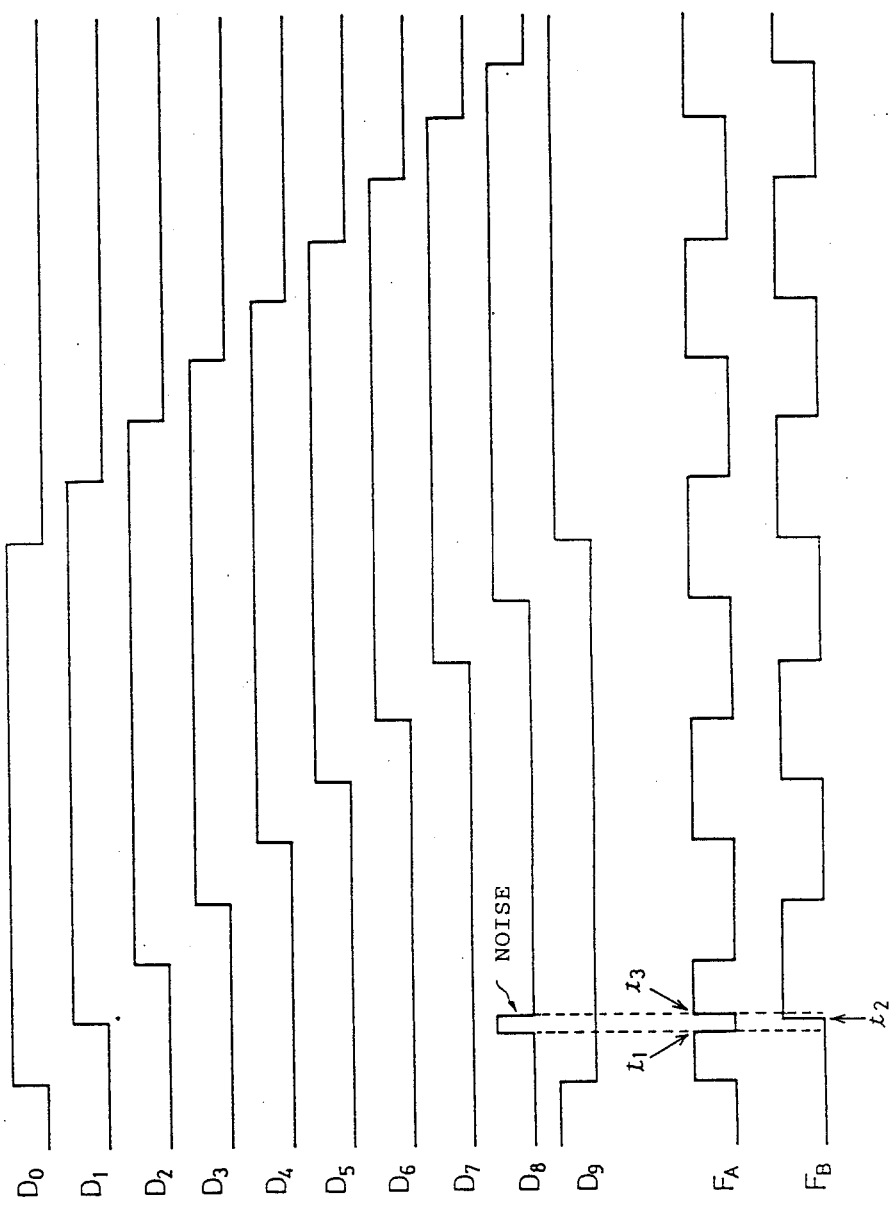
FIG. 8 shows the influence of noise superimposed on a processed signal on the wave shapes of the output in the pulse encoder circuit of FIG. 4.

The digital pulse circuit in FIG. 10 is provided with a clock generator 7 which generates clock pulses having a cycle time longer than the minimum readable time interval in a counter (400 ns in this embodiment in the NC apparatus (not shown). In this counter, the output pulse of the pulse encoder, in which the digital pulse circuit according to the present invention is used, is counted. In addition, the abovementioned digital pulse circuit has N clock-synchronizing portions $1_0, 1_1, \ldots 1_{N-1}$ and an enable signal output portion 2. Each of the N clock synchronizing portions synchronizes the corresponding one of the N outputs $D_0, D_1, \ldots D_{N-1}$ (as shown in FIG. 5) from the aforementioned comparator 121 in FIG. 9 by the clock pulse mentioned above. The enable signal output portion 2 receives N outputs $D_0', D_1', \ldots D_{N-1}'$ from the abovementioned N clock-synchronizing portions $1_0, 1_1, \ldots 1_{N-1}$, at N input terminals $1_0, \ldots 1_{N-1}$ respectively. At N output terminals $0_0, 0_1, \ldots 0_{N-1}$ of the enable signal output portion 2, the output signal corresponding to each of these input signals appears. The enable signal output portion 2 recognizes two signals among the aforementioned N digital signals $D_0, D_1, \ldots D_{N-1}$ which can change its state (rise to a high level or fall to a low level) in the next operation. The enable signal output portion 2 outputs the enable signals to the two signals whereby only the above two signals can enter the abovementioned N clock-synchronizing portions $1_0, 1_1, \ldots 1_{N-1}$. The N signals $D_0', D_1', \ldots D_{N-1}'$ are obtained by synchronizing each of the N signals $D_0, D_1, \ldots D_{N-1}$ by the abovementioned clock pulse, where each of the N signals $D_0, D_1, \ldots D_{N-1}$, as shown in FIG. 5, inverts its own level every time a constant quantity of change in the objective quantity to be measured occurs, and phase differences between any successive signals among these N signals $D_0, D_1, \ldots D_{N-1}$ correspond to the about (including the aforementioned fluctuation in the output wave from the light-detecting device) 1/N of the abovementioned constant quantity. The enable signal output portion 2 inputs the signals $D_0', D_1', \ldots D_{N-1}'$ at any timing. For example, if $D_0' = D_1' = \ldots = D_i' = 0$, and $D_{i+1}' = \ldots = D_{N-1}' = 1$ (i=0,1,\ldots N-2), the two signals, either of which can change its state in the next operation among the aforementioned N digital signals $D_0, D_1, \ldots D_{N-1}$, are $D_i(0 \to 1)$, and $D_{i+1}(1 \to 0)$. In correspondence with this recognition, the enable signal output portion 2 outputs "1" from the output terminals $0_i$ and $0_{i+1}$ among the aforementioned N output terminals $0_0, 0_1, \ldots 0_{N-1}$, and outputs "0" from the other terminals except $0_i$ and $0_{i+1}$.

Figure 11A:
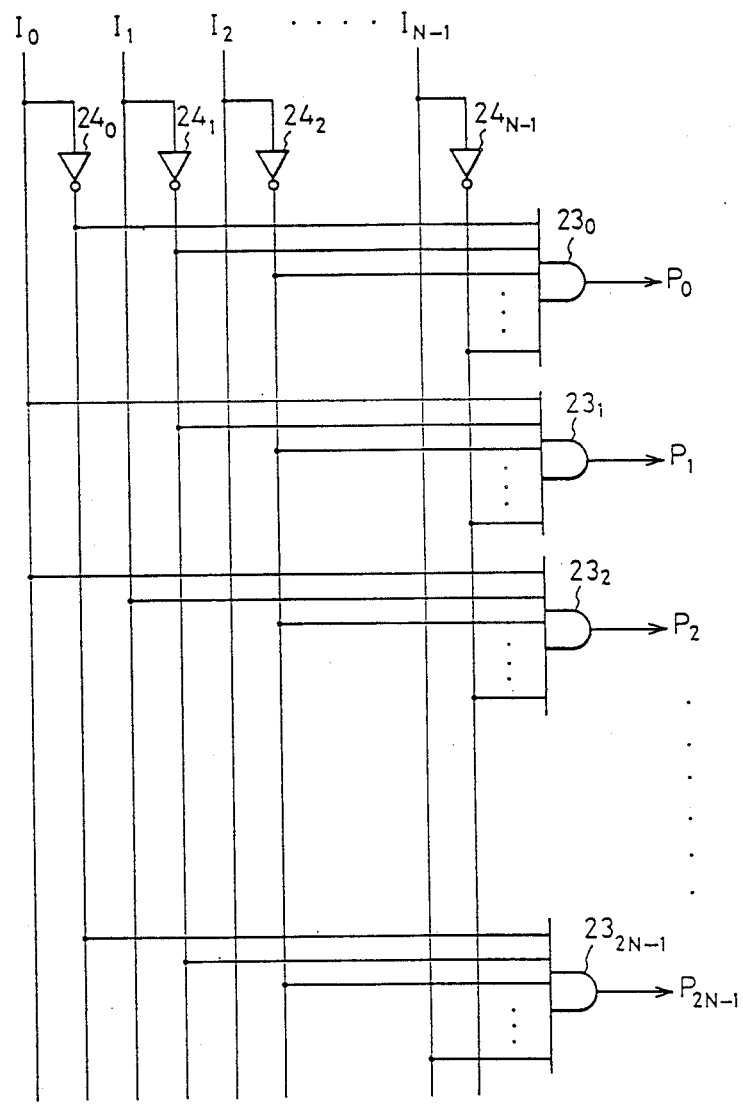
FIG. 11A and FIG. 11B show an example of the construction of the enable signal output portion 2 in FIG. 10 and FIG. 14.
Figure 11B:
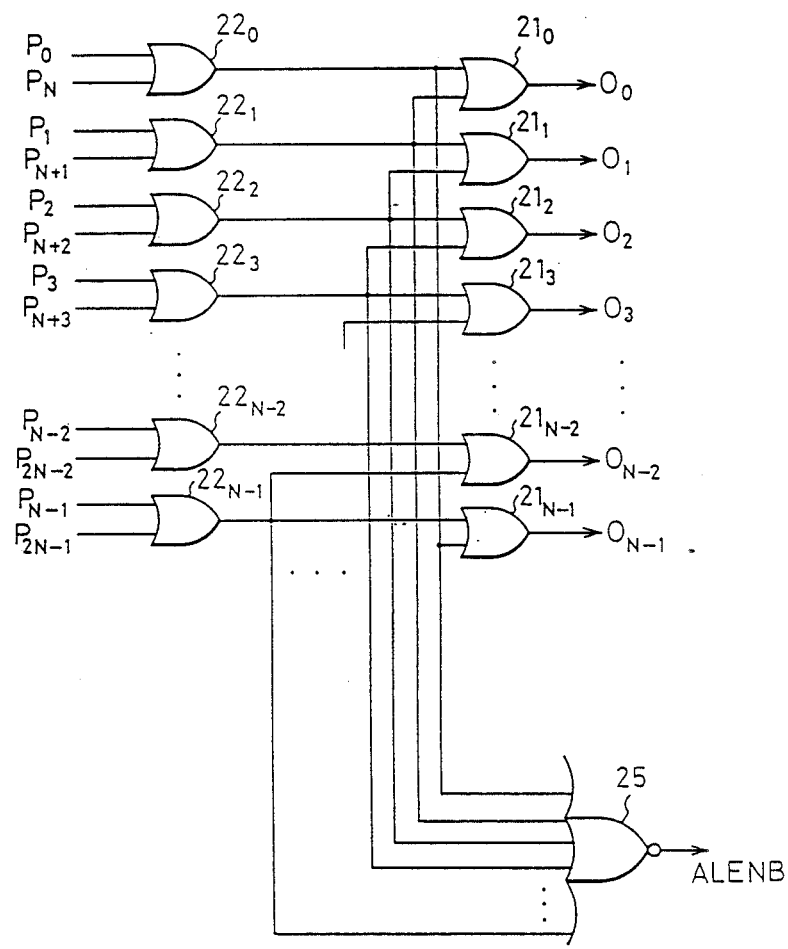

The enable signal output portion 2 in FIG. 10 as mentioned above, can be realized by the construction shown in FIG. 11A and FIG. 11B. Each of the signals $P_0, P_1, P_2, \ldots$ shown in FIG. 11A, becomes "1" when the outputs $(D_0', D_1', \ldots D_{N-1}')$ of D-flip-flop circuits $10_0, 10_1, \ldots 10_{N-1}$, are $(0,0,0, \ldots 0), (1,0,0, \ldots 0), (1,1,0 \ldots 0), \ldots$ respectively, each of the signals $P_{N-1}, P_N, P_{N+1}, \ldots$ shown in FIG. 11A, becomes "1" when the outputs $(D_0', D_1', \ldots D_{N-1}')$ are $(1, \ldots 1,0), (1, \ldots 1), (0,1, \ldots 1), \ldots$ respectively, and each of the signals $P_{2N-2}, P_{2N-1}$ shown in FIG. 11A, becomes "1" when each of the outputs $(D_0', D_1', \ldots D_{N-1}')$ is $(0, \ldots 0,1,1), (0, \ldots 0,0,1)$, respectively. These signals $P_0, P_1, \ldots P_{N-1}, P_N, P_{N+1}, \ldots P_{2N-1}$ are obtained by the construction consists of N inverters $24_0, 24_1, \ldots 24_{N-1}$ and 2N AND gates $23_0, 23_1, \ldots 23_{2N-1}$, as shown in FIG. 11A. In the composition of FIG. 11A, when $P_0 = "1"$ or $P_N = "1"$, the signals which can change its state in the next operation among $D_0, D_1, \ldots D_{N-1}$, are $D_0$ and $D_{N-1}$; when $P_1 = "1"$ or $P_{N+1} = "1"$, the signals which can change its state in the next operation among $D_0, D_1, \ldots D_{N-1}$, are $D_0$ and $D_1$; and when $P_i = "1"$ or $P_{N+i} = "1"$, the signals which can change its state in the next operation among $D_0, D_1, \ldots D_{N-1}$, are $D_i$ and $D_{i+1}$. Therefore, the construction for obtaining output signals $0_i$ and $0_{i+1}$, each of which enables the corresponding signal, $D_i$ or $D_{i+1}$ to enter the next stage, respectively, is realized by using 2N OR gates $21_0, 21_1, \ldots 21_{N-1}$ and $22_0, 22_1, \ldots 22_{N-1}$ as shown in FIG. 11B. In addition, in FIG. 11B, a NOR gate 25, which receives all the outputs of the OR gates $22_0, 22_1, \ldots 22_{N-1}$, outputs all-enable signal ALENB which enables all signals of $D_0, D_1, \ldots D_{N-1}$ in FIG. 10 to enter the next stage, when none of $P_0, P_1, \ldots P_{N-1}, P_N, P_{N+1}, \ldots P_{2N-1}$ equals "1", for example, at the time of "power-on" or the like. Although not shown, the logical sum (not shown) of each of the outputs $0_0, 0_1, \ldots 0_{N-1}$ of the enable signal output portion 2 and the output of the NOR gate 25 shown in FIG. 11B, instead of $0_0, 0_1, \ldots 0_{N-1}$, is applied to the AND gate $11_0, 11_1, \ldots 11_{N-1}$ in FIG. 10, respectively.

Each of the clock-synchronizing portions $1_0, 1_1, \ldots 1_{N-1}$ consists of a D-flip-flop circuit $10_i$ and AND gate $11_i$, and receives the corresponding signal $D_i$ (i=1 $\ldots$ N−1) at the data input terminal of the corresponding D-flip-flop circuit $10_i$. The true output $D_i'$ of the D-flip-flop circuit $10_i$ is used as the output $Q_i$ of the digital pulse circuit 8. The AND gate $11_i$ receives the clock pulse from the clock generator 7 at one of the input terminals, and another input terminal of the AND gate $11_i$ is connected to the corresponding output terminal $0_i$ of the enble signal output portion 2. The output terminal of the AND gate $11_i$ is connected to the edge-trigger terminal of the correspomding D-flip-flop circuit $10_i$, and therefore, the clock pulse from the clock generator 7 is applied to the D-flip-flop circuit $10_i$, only when the enable signal from the active enable signal output portion 2 is applied to the AND gate $11_i$. As the output of the D-flip-flop circuit $10_i$ does not change state unless receiving the leading edge of the clock pulse, the enable signal can be regarded as the signal which enables the clock pulse to enter the corresponding D-flip-flop $10_i$. From another point of the view, the enable signal can be regarded as the signal which enables the signal $D_i$ to enter the corresponding D-flip-flop $10_i$, i.e. which enables the D-flip-flop circuit $10_i$ to respond to the input signal $D_i$ so that the D-flip-flop circuit $10_i$ can output $D_i'$ corresponding to the input signal $D_i$.

Figure 12:
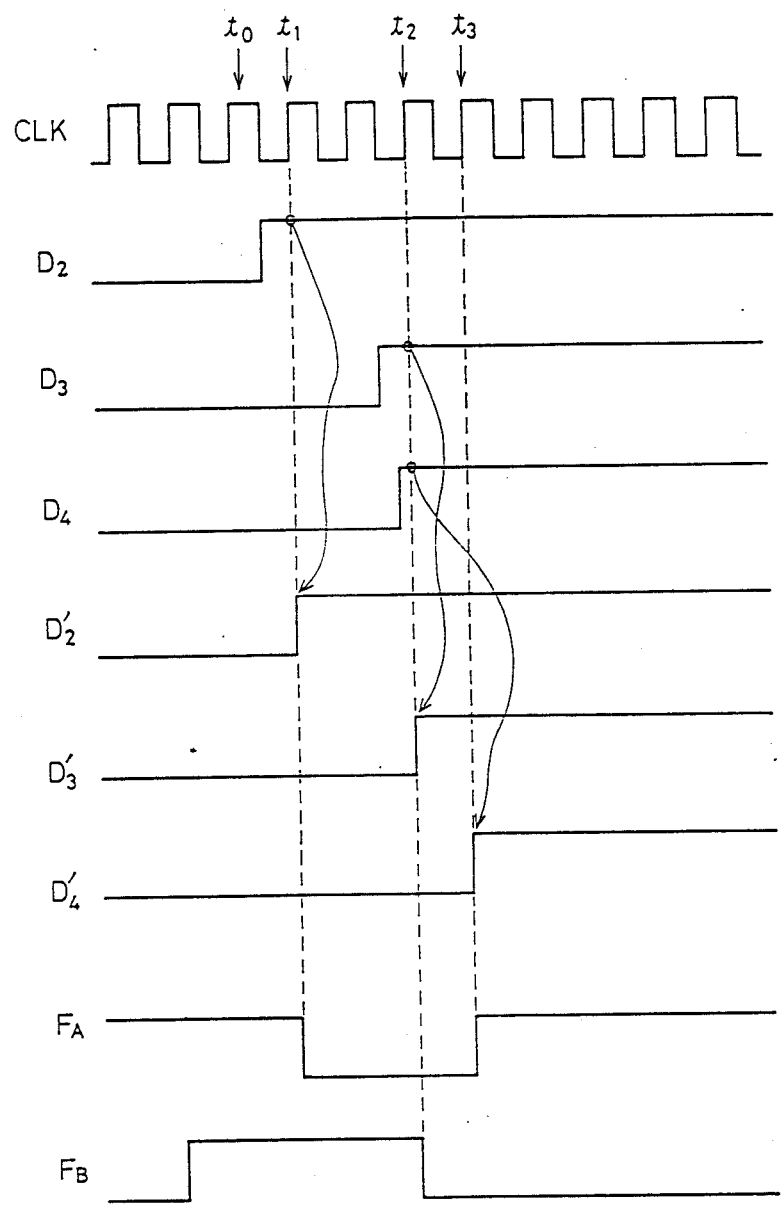
FIG. 12 shows the operation of the circuit of FIG. 10.

Referring now to a timing chart in FIG. 12, the operation of the digital pulse circuit in FIG. 10 is explained.

During the time from $t_0$ to $t_1$, the signal $D_2$ changes from 0 to 1. Therefore, at the time $t_1$, synchronized by the rising transition of the clock signal, the output signal $D_2'$ of the D-flip-flop circuit $10_2$ to which the signal $D_2$ has been applied, changes from 0 to 1, because just before the time $t_1$, $D_1' = 1$, and $D_2' = D_3' = \ldots = D_{N-1}' = 0$, so only $D_1'$ and $D_2'$ are enabled to change. Then, during the time from $t_1$ to $t_2$, the signals $D_3$ and $D_4$ change from 0 to 1. In this case, just before the time $t_2$, $D_1' = D_2' = 1$, and $D_3' = D_4' = \ldots = D_{N-1}' = 0$, so only $D_2'$ and $D_3'$ are enabled to change. Therefore, at the time $t_2$, the output $D_4'$ of the D-flip-flop circuit $10_4$ does not respond to the input signal $D_4$, and only the output $D_3'$ of the D-flip-flop circuit $10_3$ responds to the input signal $D_3$, and changes from 0 to 1. At the next rising timing of the clock pulse $t_3$, the output $D_4'$ of the D-flip-flop circuit $10_4$ changes from 0 to 1. Even if a time interval exists between the timings of the transitions in any two signal levels among the N input signals applied to the construction of FIG. 10, which is shorter than the cycle time of the clock pulse, the intervals between the timings of the transitions in any two signal levels among the N output signals $D_0', D_1', \ldots D_{N-1}'$(which equals $Q_0, Q_1, \ldots Q_{N-1}$) of the construction of FIG. 10, are equal to or greater than the cycle time of the clock pulse, that is, the aforementioned minimum readable time interval is maintained. Therefore, the time intervals between the timings of the transitions in the output signals $F_A, F_B$ are equal to or greater than the above cycle time of the clock pulse, and consequently, these signals can be counted by the counter (for example, in the NC apparatus) without misreading.

In addition, because only two input signals are enabled to enter the next stage at the same time among $D_0, D_1, \ldots D_{N-1}$, the noise which superposes on any input signals except the above two enabled signals has no influence on the output signals $D_0', D_1', \ldots D_{N-1}'$ of the construction of FIG. 10.

However, in the following special case, the abovementioned digital pulse circuit for maintaining a pulse width and suppressing noise according to the first aspect of the present invention, can not suppress some noise which appears at the timing mentioned below. This case is discussed with referrence to FIG. 13.

Figure 13:
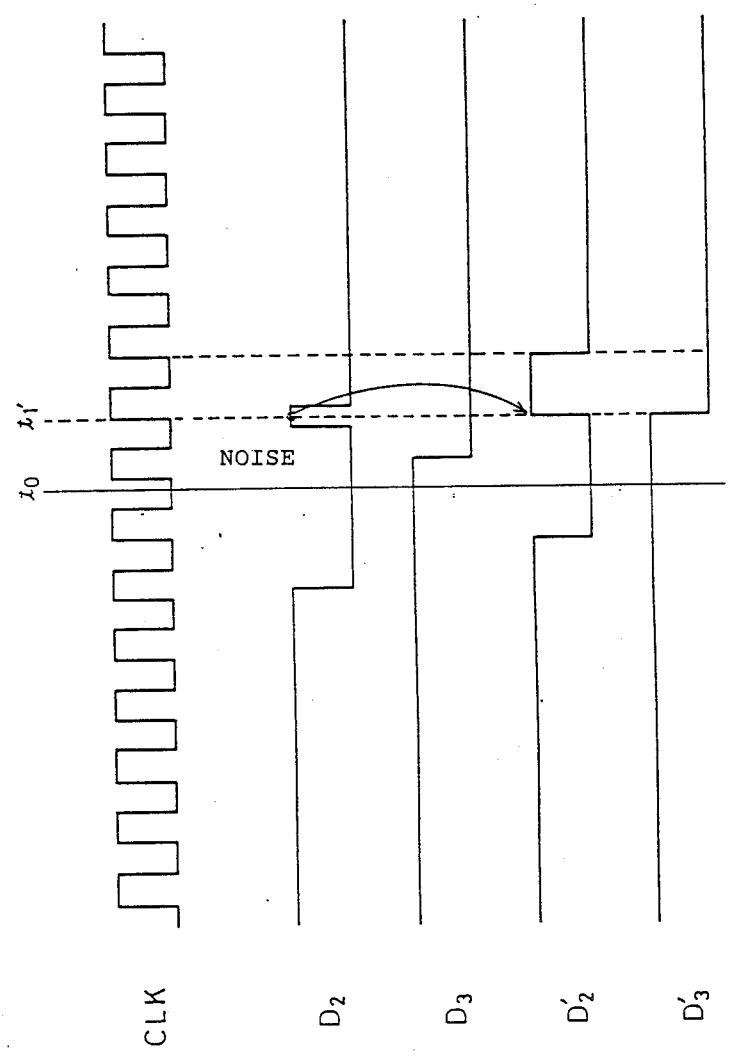
FIG. 13 shows an abnormal case which can occurs in the digital pulse circuit according to the first aspect of the present invention.

In FIG. 13, at the time $t_0$, only $D_2$ and $D_3$ are enabled, as mentioned before. In this situation, if the objective quantity to be measured increases (i.e. the time proceeds towards the right direction in FIG. 13), at first, $D_3$ changes from 1 to 0 (Cf. $D_3$ in FIG. 13). Then, at the timing of the next rising of the clock pulse, $D_3'$ changes from 1 to 0 (Cf. $D_3'$ in FIG. 13). However, if a noise is superposed on the signal $D_2$, which is also enabled together with $D_3$ at the same timing as the abovementioned next rising time (Cf. $D_2$ in FIG. 13), $D_2'$ also changes from 0 to 1 at this timing (Cf. $D_2'$ in FIG. 13). This means that an abnormality appears in the signal due to the influence of the.

In order to remove the above abnormality, in the second aspect of the present invention; a first means (first kind of clock-synchronizing portion) which receives the aforementioned signals $D_0, D_1, \ldots D_{N-1}$ and synchronizes each of the N digital signals by the clock pulse having a cycle time, is greater than the minimum readable time interval at the aforementioned counter; a second means (second kind of clock-synchronizing portion) which synchronizes once again each of the output signals from the first means by the above clock pulse; a third means which enables only two signals which can change states in the next change of the aforementioned objective quantity to be measured, among the output signals to the first means, to enter the second means; and a fourth means for detecting the existence of two signals among the output signals of the first means, which have changed states (risen to a high level or fallen to a low level) at the same time (during the same cycle of the clocks, among the outputs signals from the first means, and maintaining the output signals from the second means corresponding to the two signals, in the states just before the change of the states, until one of the two signals returns to the state just before the change; are provided.

In the following part, the second aspect of the present invention is explained with referrence to FIG. 14 which shows the construction of that embodiment.

Figure 14:
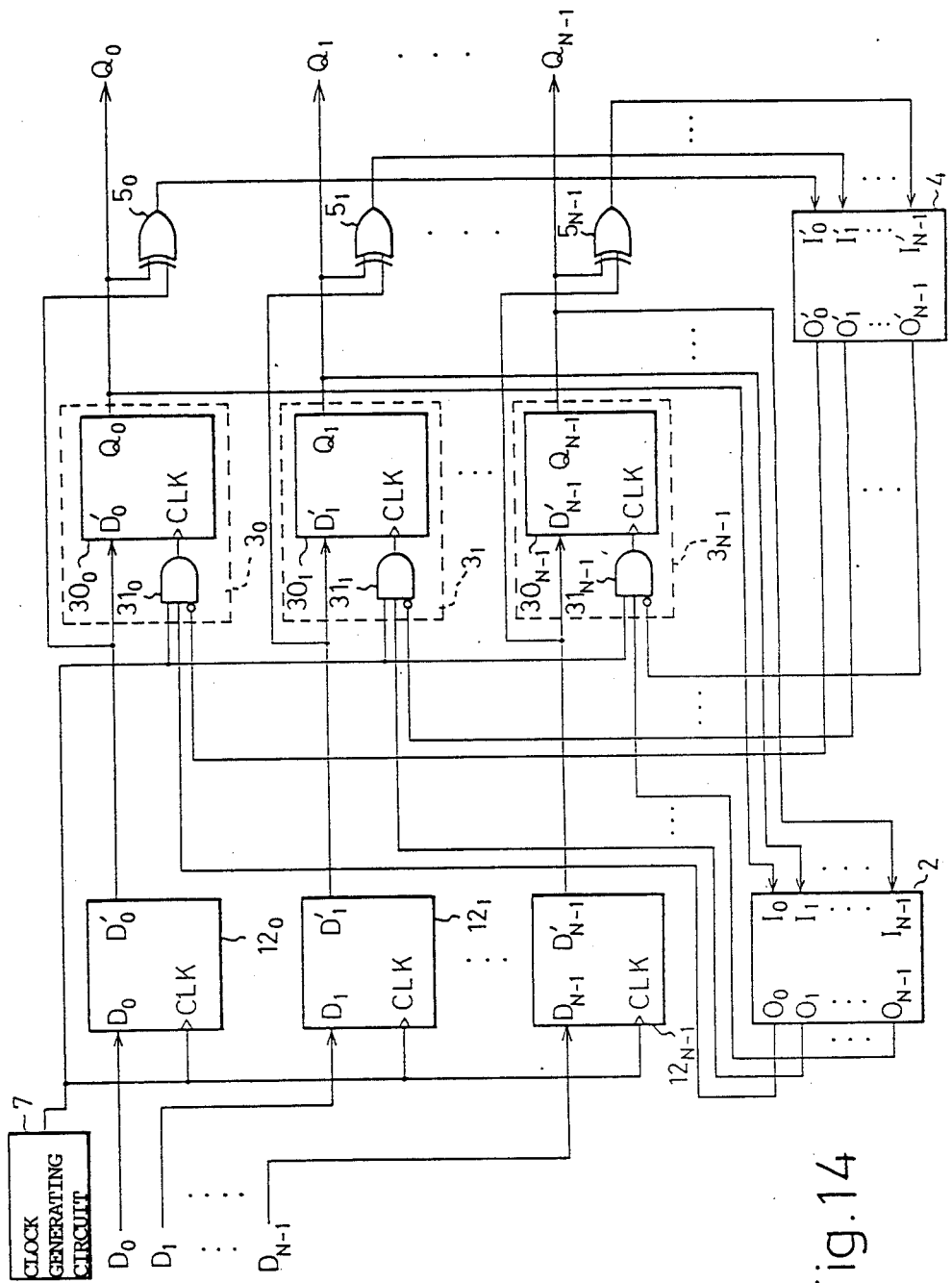
FIG. 14 shows an example of the construction of the digital pulse circuit for processing successive pulses according to the second aspect of the present invention.

The composition of FIG. 14 comprises a group of the first kind of clock-synchronizing portions $12_0, 12_1, \ldots 12_{N-1}$ provided for each of input signals $D_0, D_1, \ldots D_{N-1}$. A group of the second kind of clock-synchronizing portions $3_0, 3_1, \ldots 3_{N-1}$ provided for each of output signals $D_0', D_1', \ldots D_{N-1}'$ of the first kind of clock-synchronizing portions. An enable signal output portion 2 receives each of the output signals $Q_0, Q_1, \ldots Q_{N-1}$ of the second kind of clock-synchronizing portions $3_0, 3_1, \ldots 3_{N-1}$ at the N input terminals $I_0, I_1, \ldots I_{N-1}$, and outputs enable signals which enable only two signals among the N output signals of the first kind of clock-synchronizing portions, to enter the corresponding second kind of clock-synchronizing portions which can change states (rise to high or fall to low) in the next operation, among the input signals $D_0', D_1', \ldots D_{N-1}'$, Each of the leading edgetrailing detecting portions $5_0, 5_1, \ldots 5_{N-1}$ each of which detects leading edges or tailing edges of the corresponding one of the output signals $D_0', D_1', \ldots D_{N-1}'$ of the first kind of clock-synchronizing portions, by comparing the corresponding one of the output signals $D_0', D_1', \ldots D_{N-1}'$ with the corresponding one of the output signals $Q_0, Q_1, \ldots Q_{N-1}$ of the second kind of clock-synchronizing portions $3_0, 3_1, \ldots 3_{N-1}$. An output-maintaining signal output portion 4 which receives the outputs of the leading edge-trailing edge detecting portions $5_0, 5_1, \ldots 5_{N-1}$, and detects that two signals $D_K', D_L'$ among the output signals $D_0', D_1', \ldots D_{N-1}'$ which have changed states (risen to a falling to a high level or low level) at the same time (during the same cycle of the clock), and then outputs the signals which maintain the output signals $Q_K, Q_L$ of the second kind of clock-synchronizing portions $3_K, 3_L$ corresponding to the above two signals $D_K', D_L'$, in the states just before the changes, until one of the two signals $D_K', D_L'$ returns to the state just before the change. A clock pulse generator 7 generates clock pulses having a cycle time longer than the minimum readable time interval at the counter in the NC apparatus which counts the output signals of the pulse encoder.

Each of the N first kind of clock-synchronizing portions $12_0, 12_1, \ldots 12_{N-1}$ is realized by using a D-flip-flop circuit respectively, and each of the N second kind of clock-synchronizing portions $3_0, 3_1, \ldots 3_{N-1}$ is realized by using the corresponding combination of D-flip-flop circuits $30_0, 30_1, \ldots 30_{N-1}$ and AND gates $31_0, 31_1, \ldots 31_{N-1}$ respectively, in the construction of FIG. 14.

Each of the aforementioned input signals $D_0, D_1, \ldots D_{N-1}$ is applied to the data input terminals of the corresponding D-flip-flop circuit which realizes the corresponding one of the first kind of clock-synchronizing portions $12_0, 12_1, \ldots 12_{N-1}$ respectively. The clock pulse from the clock pulse generator 7 is applied to the edge-trigger terminal of each of the D-flip-flop circuits. Then, synchronizing the input signals with the clock pulse, each of the D-flip-flop circuits outputs the corresponding one of the true output signals $D_0', D_1', \ldots D_{N-1}'$.

Each of the output signals $D_0', D_1', \ldots D_{N-1}'$ of the correspondiong one of the first kind of clock-synchronizing portions $12_0, 12_1, \ldots 12_{N-1}$ is applied to the data input terminals of the corresponding D-flip-flop circuit $30_0, 30_1, \ldots 30_{N-1}$. These D-flip-flop circuits $30_0, 30_1, \ldots 30_{N-1}$, then output the true output signals $D_0', D_1', \ldots D_{N-1}'$. Each output of the AND gates $31_0, 31_1, \ldots 31_{N-1}$ is applied to the edge-trigger terminal of the corresponding one of the D-flip-flop circuits $30_0, 30_1, \ldots 30_{N-1}$. To each of the AND gates $31_0, 31_1, \ldots 31_{N-1}$, the clock pulse from the abovementioned clock pulse generator 7, the output from the corresponding one of the N output terminals $0_0, 0_1, \ldots 0_{N-1}$ in the enable signal output portion 2, and the inverted signal of the output from the corresponding one of the N output terminals $0_0', 0_1', \ldots 0_{N-1}'$, are applied. In this construction, the clock pulse is applied to each of the D-flip-flop circuits $30_0, 30_1, \ldots 30_{N-1}$ only when the corresponding enable signal is active ("1") and the corresponding output-maintaining signal is non-active ("0"), that is, only under this condition is the corresponding signal $D_i'$ enabled to input into the corresponding D-flip-flop circuit $30_i$.

The enable signal output portion 2 is realized by the construction of FIG. 11A and FIG. 11B, as in the aforementioned construction of FIG. 10.

Each of the leading edge-trailing edge detecting portions $5_0, 5_1, \ldots 5_{N-1}$ comprises an EOR gate. To one terminal of each of the EOR gates $5_0, 5_1, \ldots 5_{N-1}$, the corresponding one of the outputs $D_0', D_1', \ldots D_{N-1}'$ of the mentioned first kind of clock-synchronizing portions $12_0, 12_1, \ldots 12_{N-1}$ is applied, and to the other terminal of each of the EOR gates $5_0, 5_1, \ldots 5_{N-1}$, the corresponding one of the outputs $Q_0, Q_1, \ldots Q_{N-1}$ of the mentioned second kind of clock-synchronizing portions $3_0, 3_1, \ldots 3_{N-1}$ is applied. For example, if $D_i'$ among the above signals $D_0', D_1', \ldots D_{N-1}'$, changes state, since the corresponding output signal $Q_i$ changes state at the next rising of the clock pulse in the corresponding second kind of clock-synchronizing portions $3_i$, until that rising time, $D_i' \neq Q_i$, the output of the EOR gates $5_i$ is "1". Therefore, the leading edge or the trailing edge of $D_i'$ can be detected.

Figure 15:
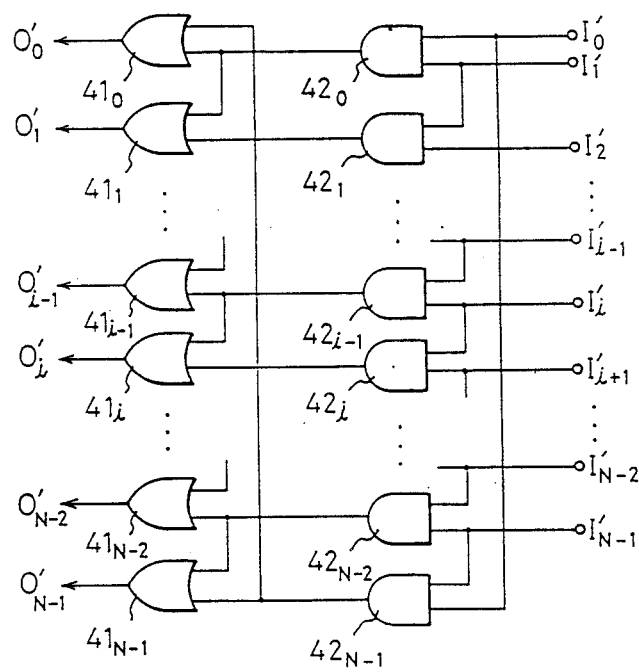
FIG. 15 shows an example of the construction of the output-maintaining signal output portion 4.

The detailed construction of the output-maintaining signal output portion 4 is shown in FIG. 15. Since, owing to the operation of the enable signal only the two signals adjacent to each other in the order of phase progress, for example, $D_i'$ and $D_{i+1}'$ (including the case of $D_{N-1}'$ and $D_0'$), can become enabled (change states) at the same time due to the operation of the signal output portion 2, the output-maintaining signal output portion 4 in FIG. 15 includes a row of AND gates $42_0$, $42_1$, ... $42_{N-}$ and a row of OR gates $41_0$, $41_1$, ... $41_{N-1}$. Each of the AND gates detects the two adjacent outputs having levels "1" at the same time. The two adjacent outputs are among the N outputs of the mentioned N leading edge-trailing edge detecting portions $5_0$, $5_1$, ... $5_{N-1}$. A row of OR gates $41_0$, $41_1$, ... $41_{N-1}$ output the output-maintaining signals to maintain the outputs $Q_i$, $Q_{i+1}$ of the corresponding second kind of clock-synchronizing portions $3_i$, $3_{i+1}$. To each of the portions $3_i$, $3_{i+1}$ the corresponding one of the two changed signals as mentioned above, $D_i'$ and $D_{i+1}'$ is applied. Each changed signal makes the corresponding output of the leading edge-trailing edge detecting portions $5_i$, $5_{i+1}$ to be "1".

Figure 16:
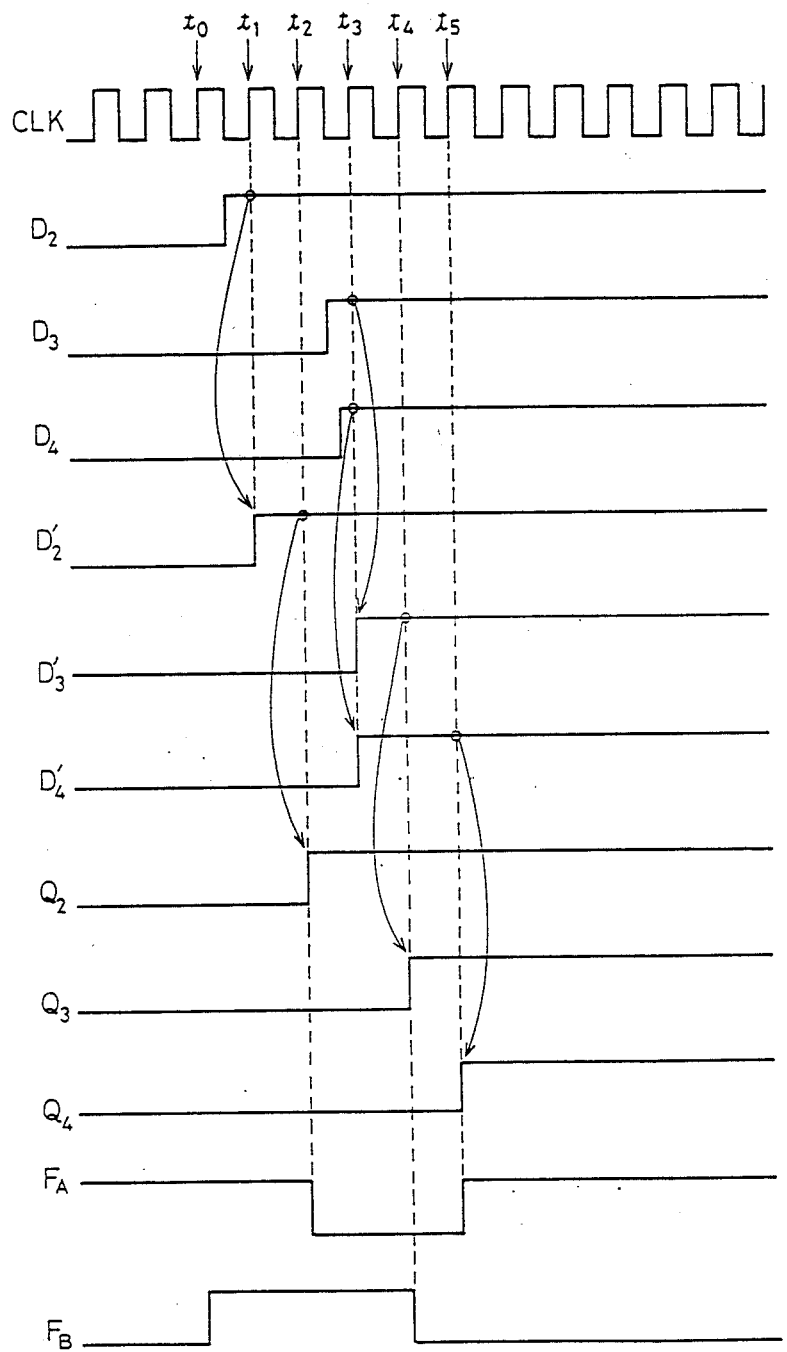
FIG. 16 shows the operation of the circuit in FIG. 14.

Referring to a timing chart of FIG. 16, the operation of the digital pulse circuit of the construction as mentioned above, is explained as follows:

During the time interval from the timing $t_1$ and $t_2$, $D_2$ changes from 0 to 1. Then, at the time $t_2$, synchronizing with the rising of the clock pulse, the output $D_2'$ of the corresponding first kind of clock-synchronizing portions $12_2$ changes from 0 to 1, and at the next timing of the rising of the clock pulse $t_2$, the output $D_2'$ of the corresponding second kind of clock-synchronizing portions $3_2$ changes from 0 to 1. Since $Q_0 = Q_1 = 1$, $Q_2 = Q_3 = \ldots = Q_{N-1} = 0$ at the time of just before $t_2$, the enable signals having a "1" level are output from the output terminals $0_1$ and $0_2$ only in the enable signal output portion to enable $D_1'$ and $D_2'$ to enter the next stage, and consequently, only the signals $D_1'$ and $D_2'$ become enabled.

During the time interval from the timing $t_2$ and $t_3$, the input signals $D_3$ and $D_4$ change from 0 to 1. Then, at the time $t_3$, synchronizing with the rising of the clock pulse, the outputs $D_3'$ and $D_4'$ of the corresponding first kind of clock synchronizing $12_3$ and $12_4$ change from 0 to 1, and at the next timing of the rising of the clock pulse $t_4$, the outputs $Q_3'$ and $Q_4$ of the corresponding second kind of clock-synchronizing portions $3_3$ and $3_4$ cannot change from 0 to 1 at the same time. Since $Q_0 = Q_1 = Q_2 = 1$, $Q_3 = Q_4 = \ldots = Q_{N-1} = 0$ at the time of just before $t_4$, among $D_0'$, $D_1'$, ... $D_{N-1}'$, the signals which is enabled to enter the corresponding second kind of clock-synchronizing portions, i.e. which can change the output of the corresponding second kind of clock-synchronizing portions, are only $D_2'$ and $D_3'$. Therefore, at the timing of rising of the clock pulse $t_4$, only the output $Q_3$ of the second kind of clock-synchronizing portions $3_3$, which corresponds to the signal $D_3'$, changes from 0 to 1. After that, the outputs of the second kind of clock-synchronizing portions $3_0$, $3_1$, ... $3_{N-1}$ become $Q_0 = Q_1 = Q_2 = Q_3 = 1$, $Q_4 = Q_5 = \ldots = Q_{N-1} = 0$, and therefore, $D_4'$ is enabled. Then, at the next timing of the rising of the clock pulse $t_5$, the output $Q_4$ of the second kind of clock-synchronizing portions $3_5$, also changes from 0 to 1. As mentioned above, also in the construction of FIG. 14, even if a time interval exists between any timings of transitions in the N input signals $D_0$, $D_1$, ... $D_{N-1}$, which is shorter than the cycle time of the aforementioned clock pulse, the time interval between any timings of transitions in the N output signals $Q_0$, $Q_1$, ... $Q_{N-1}$, becomes longer than the cycle time of the clock pulse, that is, the aforementioned minimum readable time interval maintained. Therefore, the time intervals between any timings of transitions in the output signals $F_A$, $F_B$, which are obtained by applying the abovementioned $Q_0$, $Q_1$, ... $Q_{N-1}$ to the A/B-phase signal generating circuit 6 in FIG. 9, become longer than the abovementioned cycle time, so these signals $F_A$, $F_B$ are readable at the counter (for example, in the NC apparatus).

In addition, in the construction of FIG. 14, when the two signals which are enabled by the operation of the enable signals from the enable signals output portion 2, for example, $D_2'$ and $D_3'$, change states at the same time; the corresponding leading edge-trailing edge detecting portion $5_2$ and $5_3$ detect these changes, and then the output-maintaining signal output portion 4 detects that both the outputs of the leading edge-trailing edge detecting portions $5_2$ and $5_3$ were changed to "1" at the same time. The output-maintaining signal output portion 4 outputs the output-maintaining signals to the corresponding second kind of clock-synchronizing portions $3_2$ and $3_3$, so that the outputs $Q_2$ and $Q_3$ of these second kind of clock-synchronizing portions $3_2$ and $3_3$ are maintained. After that, when, for example, in the case of FIG. 13, the noise superposed on the input signal $D_2$, disappears, and then the output $D_2'$ of the corresponding first kind of clock-synchronizing portion $12_2$ returns to the proper level. Accordingly, the output of the corresponding leading edge-trailing edge detecting portion $5_2$ becomes zero, and the above outputs of the output-maintaining signal output portion 4 becomes non-active ("0"). After that, the output $Q_3$ of the second kind of clock-synchronizing portions $3_2$ can be changed properly according to the level of $D_3'$.

As stated above, according to the second aspect of the present invention, all anticipated noise can be suppressed.

The inventers realized the circuit according to the present invention by using a gate array circuit.

INDUSTRIAL APPLICABILITY

The digital pulse circuit according to the present invention is, in particular, useful as a means of obtaining incremental timing information with a high resolution from the output wave of the light-detecting portion in a high resolution pulse encoder.

We claim:

1. A digital pulse circuit which receives a plurality of digital signals in parallel said plurality being an even integer N equal to or greater than 4, a digital level of each of said digital signals is inverted every time a constant quantity of change in an objective quantity to be measured occurs, and phase differences between any successive digital signals among said plurality of digital signals correspond to about 1/N of said constant quantity, said digital pulse circuit comprising:
   a clock pulse generator which generates clock pulses having a predetermined cycle time;
   a first means for receiving said plurality of digital signals and for synchronizing each of the plurality of digital signals by said clock pulses; and a second means for enabling only two signals among said plurality of digital signals to enter said first means, said two digital signals can change state in a next change of said objective quantity to be measured by 1/N of said constant quantity.

2. A digital pulse circuit according to claim 1; in which said first means has a group of N clock-synchronizing portions each of said N clock-synchronizing portions is provided for each of said plurality of digital signals; and each of said N clock-synchronizing portions synchronizes the corresponding one of said plurality of digital signals by said clock pulse.

3. A digital pulse circuit according to claim 2; in which each of said N clock-synchronizing portions ($1_{n-1} \ldots 1_{n-}$) has a corresponding D-flip-flop circuit ($10_{n-1} \ldots 10_{n-1}$) respectively.

4. A digital pulse circuit according to claim 2; in which said second means consists of an enable signal output portion which receives an output signal from each of said group of N clock-synchronizing portions, said enable signal output portion determines which two output signals among said N output signals can change state corresponding to a next change of said objective quantity to be measured by 1/N of said constant quantity, and said enable signal output portion outputs enable signals which enable two digital signals, which are applied to two clock-synchronizing portions corresponding to said two output signals, to enter the clock-synchronizing portions.

5. A digital pulse circuit according to claim 4; in which each of said N clock-synchronizing portions has a D-flip-flop circuit, and a gate circuit, each gate circuit receives said clock pulse and the corresponding one of said enable signals at input terminals thereof, and each gate circuit having an output terminal connected to an edge-trigger input terminal of the corresponding one of said D-flip-flop circuits.

6. A digital pulse circuit according to claim 4; in which said enable signal output portion having a first group of 2N gate circuits, each of said first group of 2N gate circuits outputs an active signal in a corresponding one of 2N possible conditions, said conditions determined by receiving the N output signals from said group of N clock-synchronizing portions, and each of said first group of 2N gate circuits decoding a combination of levels of said N output signals ; said enable signal output portion having a second group of 2N gate circuits, each of said second group of 2N gate circuits outputs an enable signal which enables a corresponding one of said N digital signals to enter a corresponding one of said N clock-synchronizing portions;

each output of said first group of 2N gate circuits, is applied to corresponding two gate circuits among said second group of 2N gate circuits; said corresponding two gate circuits output said enable signals for said two digital signals, among said N digital signals, which can change stage in said next change of 1/N of said constant quantity, under said condition determined by the outputs of said first group of 2N gate circuits, among said N digital signals.

7. A digital pulse circuit according to claim 6; which has a third gate circuit which receives all signals applied to said second group of 2N gate circuits; and said third gate circuit outputs and all-enable signal which enables all of said N digital signals to enter said N clock-synchronizing portions, when said all signals applied to said second group of 2N gate circuits are non-active.

8. A digital pulse circuit which receives a plurality of digital signals in parallel, where N is an even integer equal to or greater than 4, a digital level of each of said N digital signals is digitally inverted every time a constant quantity of change in an objective quantity to be measured occurs, and phase differences between any successive signals in said N digital signals corresponding to about 1/N of said constant quantity, said digital pulse circuit comprising:

a clock pulse generator generates a clock pulse having a predetermined cycle time;

a first means for receiving said plurality of digital signals and for synchronizing each of the digital signals by said clock pulse;

a second means for synchronizing each output signal of said first means by said clock pulse;

a third means for enabling only two signals among output signals of said first means to enter said second means, said two signals can change a state in a next change of said objective quantity to be measured by said constant quantity;

a fourth means for detecting an existence of two signals, among output signals from said first means which have changed state (risen to a high level or fallen to a low level), during the same cycle of said clock and said fourth means for maintaining the output signals from said second means which correspond to said two signals, in the states just before the change of the states, until one of said two signals returns to the state just before said change.

9. A digital pulse circuit according to claim 7; in which said first means has a group of N first kind of clock-synchronizing portions each provided for each of said N digital signals; and each of said first N kind of clock-synchronizing portions synchronizes the corresponding N digital signal by said clock pulse.

10. A digital pulse circuit according to claim 9; in which each of said N first kind of clock-synchronizing portions has a corresponding D-flip-flop circuit respectively.

11. A digital pulse circuit according to claim 8 or 9; in which said second means consists of a group of N second kind of clock-synchronizing portions each synchronizes a corresponding one of the output signals of said first means with said clock pulse.

12. A digital pulse circuit according to claim 11; in which each of said group of N second kind of clock-synchronizing portions has a corresponding D-flip-flop circuit respectively.

13. A digital pulse circuit according to claim 11; in which said third means consists of an enable signal output portion which receives an output signal from each of said group of N second kind of clock-synchronizing portions, said enable signal output portion recognizes two output signals among said N output signals of said group of N second kind of clock-synchronizing portions which can change state corresponding to a next change of said objective quantity to be measured by 1/N of said constant quantity, signals and said enable signal output portion outputs enable signals which enable each of two output signals among the N output signals of said first means to enter a corresponding one of said second kind of clock-synchronizing portions.

14. A digital pulse circuit according to claim 13; in which said enable signal output portion having a first group of 2N gate circuits each outputting an active signal in a corresponding one of 2N possible conditions, said conditions determined by receiving the N output signals from said group of N second kind of clock-synchronizing portions, and said first group of 2N gate circuits decoding a combination of levels of said N output signals; and said enable signal output portion having a second group of 2N gate circuits each outputting an enable signal which enables a corresponding one of the output signals of said N first kind of clock-synchronizing portions to enter a corresponding one of said second kind of clock-synchronizing portions;

each output of said first group of 2N gate circuits, is applied to a corresponding two gate circuits among said second group of 2N gate circuits; said corresponding two gate circuits, output said enable signals for corresponding two signals, among said output signals of said N first kind of clock-synchronizing portions, which can change state in said next change of 1/N of said constant quantity, under said condition determined by the outputs of said first group of 2N gate circuits, among said input signals of said N second kind of clock-synchronizing portions.

15. A digital pulse circuit according to claim 14; having a third gate circuit which receives all signals applied to said second group of 2N gate circuits; and said third gate circuit outputs an all-enable signal which enables all of said N output signals of said N first kind of clock-synchronizing portions to enter said N second kind of clock-synchronizing portions, when said all signals applied to said second group of 2n gate circuits are nonactive.

16. A digital pulse circuit according to claim 11; in which said fourth means has N leading edge-trailing edge detecting means each comparing the output of the corresponding one of said first kind of clock-synchronizing portions, with the output of the corresponding one of the second kind of clock-synchronizing portions; and each said N leading edge-trailing edge detecting means for detecting a difference between a pair comprised of an output of corresponding one of said N first kind of clock-synchronizing portions and a corresponding one of said N second kind of clock-synchronizing portions;

and said fourth means has an output-maintaining signal output portion for outputting output-maintaining signals to two of said N second kind of clock synchronizing portions, said output-maintaining signals preventing two output signals of said two of said N second kind of clock-synchronizing portions, for changing own states, when said two leading edge-trailing edge detecting means corresponding to said two output signals, have detected said difference between a pair of outputs from corresponding first and second kind of clock-synchronizing portions.

17. A digital pulse circuit according to claim 16; in which each of said leading edge-trailing edge detecting means consists of an EOR gate respectively.

18. A digital pulse circuit according to claim 16; in which said output-maintaining signal output portion has N AND gates each receiving two output signals from the corresponding two of said leading edge-trailing edge detecting means which are adjacent with regard to a circulating order of phase progress; and said output-maintaining signal output portion has N OR gates corresponding to said leading edge-trailing edge detecting means, each of said N OR gates outputs a logical sum of outputs of two AND gates to which the outputs of said corresponding leading edge-trailing edge detecting means is applied and said N OR gates output said output-maintaining signals to corresponding N second kind of clock-synchronizing portions.

* * * * *